United States Patent [19]

Goldberg

[11] 4,058,716

[45] Nov. 15, 1977

[54] SURFACE CHARGE SIGNAL PROCESSING APPARATUS

[75] Inventor: Howard S. Goldberg, Schenectady, N.Y.

[73] Assignee: General Electric Company, Schenectady, N.Y.

[21] Appl. No.: 702,942

[22] Filed: July 6, 1976

[51] Int. Cl.[2] .................... G06G 7/19; G11C 11/40
[52] U.S. Cl. ................. 364/824; 307/221 C; 357/24; 364/862
[58] Field of Search .............. 235/181; 307/221 C, 307/221 D; 357/24

[56] References Cited

U.S. PATENT DOCUMENTS

| 3,935,439 | 1/1976 | Buss et al. | 235/181 |
| 3,956,642 | 5/1976 | Audaire et al. | 307/221 D |
| 3,987,292 | 10/1976 | Means | 235/181 |

OTHER PUBLICATIONS

Moshen et al.: A New Approach to Charge Coupled Devices Clocking., Appl. Physics Lett., vol. 22, No. 4, Feb. 1973, pp. 172/175.

Tiemann et al.: Charge Transfer Devices Filter Complex Communication Signals, Electronics in Nov. 14, 1974, pp. 113/116.

Primary Examiner—Felix D. Gruber
Attorney, Agent, or Firm—Julius J. Zaskalicky; Joseph T. Cohen; Jerome C. Squillaro

[57] ABSTRACT

A plurality of charge storage cells, each including first and second storage regions, are provided in a semiconductor substrate. Means are provided responsive to a scanning signal for introducing into each of the cells a respective quantity of charge proportional to a respective sample of an analog signal. Each quantity of charge includes first and second portions of equal value. Each first portion is solely contained in the first storage region of a respective cell and each second portion is contained in the second storage region of a respective cell. Means are provided responsive to the bits of one value of a digital reference word for transferring the first portions of said quantities of charge into the second storage regions in the cells associated with such bits of one value. Means are provided responsive to bits of the other value of the digital reference word for transferring the second portions of said quantities of charge into the first storage regions in the cells associated with such bits of the other value. The charges in all of the cells are transferred concurrently from one storage region to the other and the total net charge transferred to and from the first charge storage regions of all of the cells is sensed on a common conductor overlying all of the first charge storage regions of the cells.

8 Claims, 15 Drawing Figures

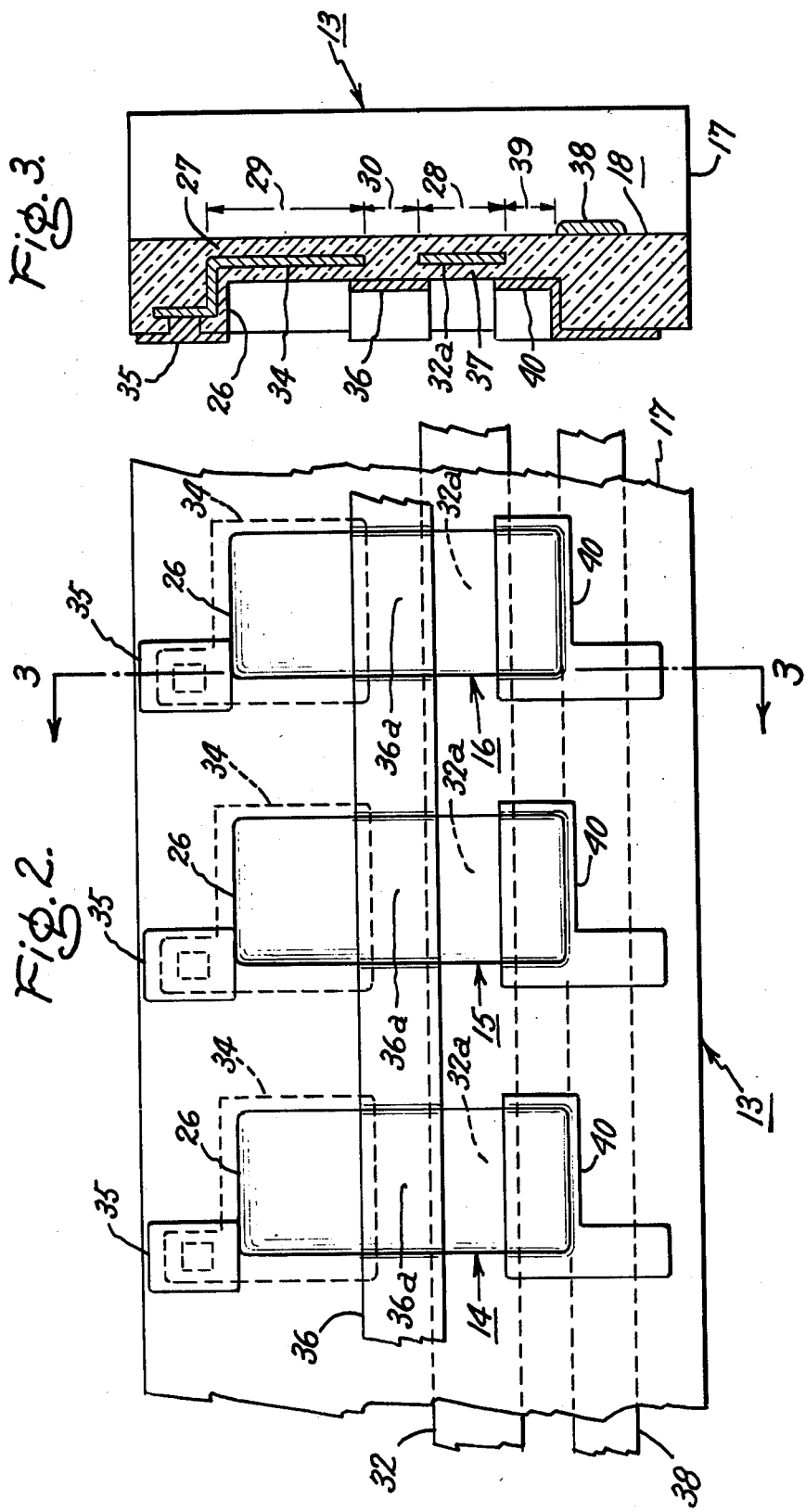

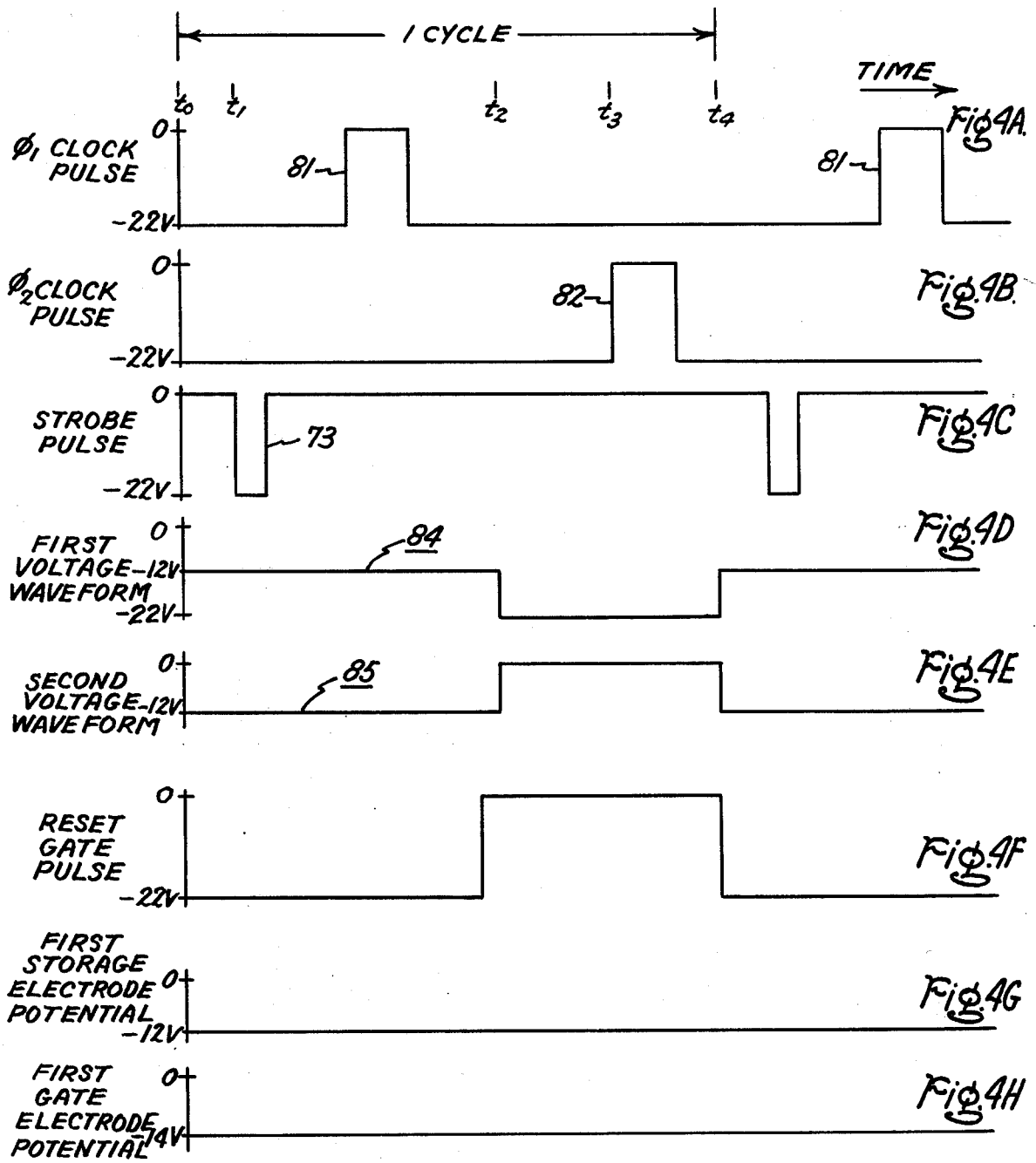

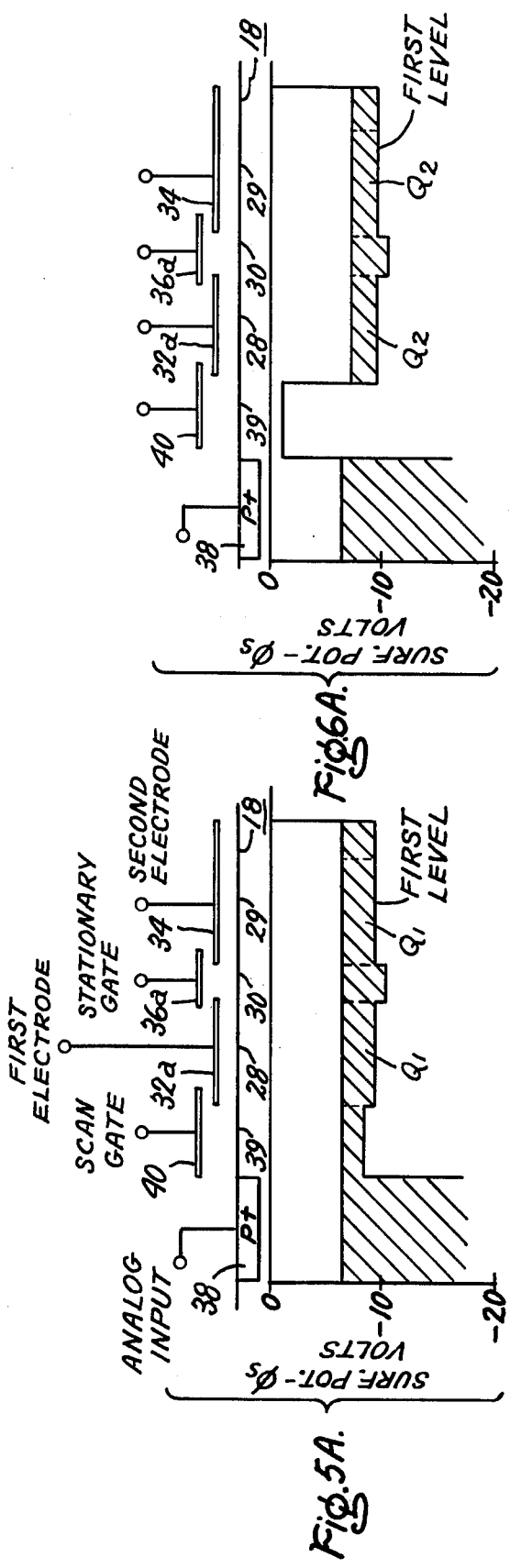
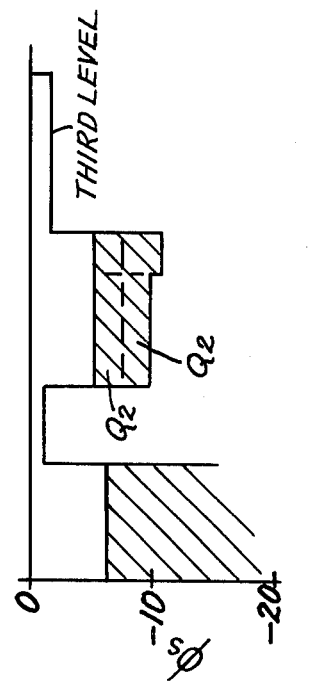
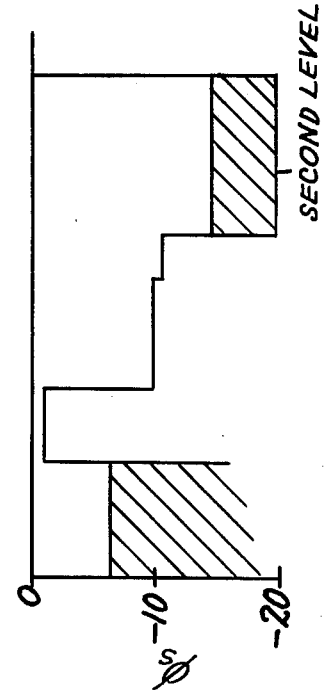
Fig. 5A.
Fig. 5B.
Fig. 6A.
Fig. 6B.

SURFACE CHARGE SIGNAL PROCESSING APPARATUS

This invention relates in general to signal processing apparatus comprising surface charge devices and in particular relates to such apparatus for obtaining the correlation between an analog signal and a digital reference word.

The subject matter of this patent application is related to the subject matter of patent application Ser. No. 702,943 and patent application Ser. No. 702,944, both filed concurrently herewith and assigned to the assignee of the present invention. The aforementioned patent applications are incorporated herein be reference thereto.

In U.S. Pat. No. 3,801,883 assigned to the assignee of this invention, surface charge signal correlation apparatus is described and claimed which includes a semiconductor substrate having a plurality of information channels or cells, each including first, second and third charge storage regions. Means are provided responsive to a scanning signal for introducing into each of the second charge storage regions a respective sample of an analog signal. Means are provided responsive to the bits of one value in a digital reference word for transferring quantities of charge from second charge storage regions to first change storage regions of the channels associated with such bits of one value and responsive to the bits of the other value of the digital reference word for transferring quantities of charge from the second charge storage regions to third charge storage regions of the channels associated with such bits of the other value. Means are provided for obtaining a first output representing a signal proportional to the charge transferred to the first charge storage regions of the channels and also for obtaining a second output representing a signal proportional to the charge transferred to the third charge storage regions of the channels. Further means are provided for obtaining the difference of the first and second outputs to obtain a total net output representing the correlation of the analog signal with the digital reference word. The implementation of such apparatus requires relatively complex devices. The rapidity with which correlations are obtained from the apparatus is limited as the operation of such apparatus involves a large number of steps.

The present invention is directed to overcoming limitations such as mentioned above and also is directed to providing improvements in surface charge signal correlation apparatus.

An object of this invention is to provide correlator apparatus using relatively simple surface charge devices organized into apparatus having a relatively simple cycle of operation.

Another object of this invention is to provide surface charge signal correlation apparatus which is capable of operation at high speed.

A further object of this invention is to provide improvements in signal processing apparatus utilizing surface charge devices which include an output electrode common to all of the devices.

In carrying out the invention in an illustrative embodiment thereof, there is provided a substrate of semiconductor material in which a plurality of charge storage cells are formed. Each cell includes a first charge storage region and also a second charge storage region adjacent a major surface of the substrate. The second charge storage region is separated from the first charge storage region by an intermediate region. A first plurality of interconnected electrodes are provided, each electrode insulatingly overlying a respective first charge storage region. A second plurality of electrodes is also provided, each insulatingly overlying a respective second charge storage region. A plurality of interconnected first gating electrodes are provided, each insulatingly overlying a respective one of the intermediate regions. Each first storage electrode forms with the substrate a first capacitance. Each second storage electrode forms with the substrate a second capacitance. Each first gating electrode forms with the substrate a third capacitance. The sum of the first capacitance and the third capacitance is set equal to the second capacitance. Means are provided for applying a fixed first potential to the first gating electrodes to establish a depletion surface potential in each of the intermediate regions of a first value. Means are provided for applying a second potential to the first storage electrodes to establish a depletion surface potential of a second value in each of the first storage regions. The second value of surface potential is less in absolute magnitude than the first value of surface potential. Means are provided for applying to each of the second storage electrodes a voltage waveform selected from a first voltage waveform and a second voltage waveform of the same periodicity in response to a respective one of a series of successive binary bits of a reference word. The bits of a first value in the series of successive bits form a first group of bits and provide the first voltage waveform to the second electrodes associated with a first group of cells. The first voltage waveform establishes a first level of depletion surface potential in the second storage regions of the first group of cells during a first interval thereof and a second level of depletion surface potential during a succeeding second interval thereof. The first level of depletion surface potential is equal to the second value of depletion surface potential and the second level of depletion surface potential is greater in absolute magnitude than the fixed first value of depletion surface potential. The bits of a second value in the series of successive bits form a second group of bits and provide the second voltage waveform to the second electrodes associated with the second group of cells. The second voltage waveform establishes the first level of depletion surface potential in the second storage region during the first interval and a third level of depletion surface potential during the second interval. The third level of depletion surface potential is less in absolute magnitude than the second value of depletion surface potential. Means are provided for introducing during said first intervals of said first and second voltage waveforms into each composite storage site formed by a respective first storage region, an adjacent second storage region and the intermediate therebetween, a respective quantity of charge, each quantity being proportional to a respective sample of a time varying analog signal. Thus, during the first interval charge is stored in the first and second group of cells and during the second interval charge is transferred from the first charge storage regions of the first group of cells to the second charge storage regions thereof and charge is also transferred from the second charge storage regions of the second group of cells to the first charge storage regions thereof. Detection means connected in circuit with the first storage electrodes sense the total net charge transferred to and from the first charge storage regions during the second interval.

The features which are believed to be characteristic of the present invention are set forth with particularity in the appended claims. The invention itself both as to its organization and method of operation, together with further objects and advantages thereof may best be understood by reference to the following description taken in connection with the accompanying drawings in which FIG. 1 is a block diagram of surface charge signal correlation apparatus in accordance with an embodiment of the present invention.

FIG. 2 is a plan view of an assembly of several charge storage cells of the surface charge signal correlation apparatus of FIG. 2 integrated on a single substrate.

FIG. 3 is a sectional view of the assembly of FIG. 2 taken along sectional lines 3—3 thereof.

Figure 1:
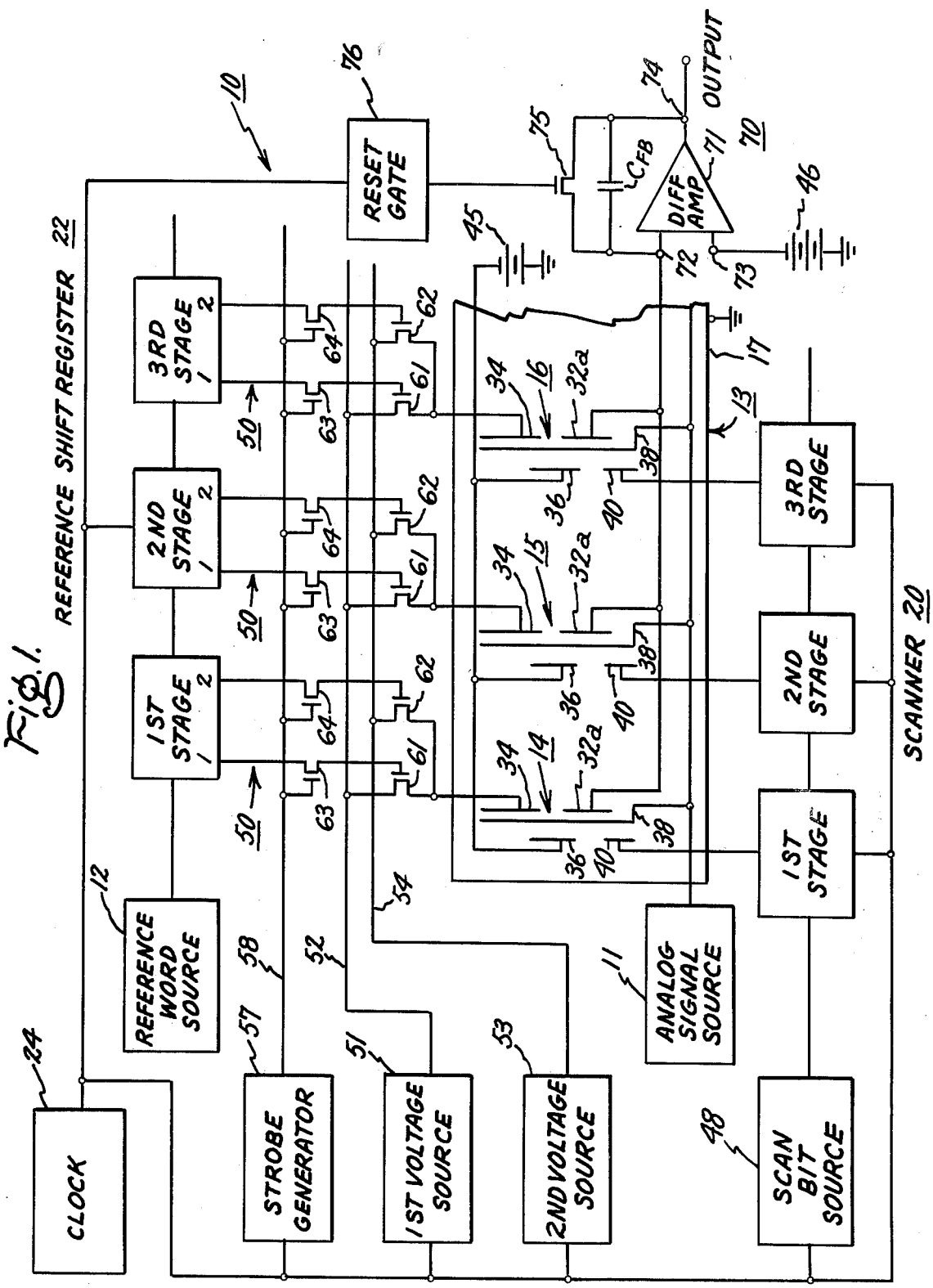

FIGS. 4A thru 4H are diagrams of amplitude versus time of voltage occurring at various points in the apparatus of FIG. 1.

FIG. 5A shows a sectional view of a charge storage cell of the apparatus of FIG. 1 and also includes a diagram of semiconductor surface potential versus distance along the semiconductor surface at an instant of time in a first interval or phase of a cycle of operation of the apparatus, referred to as the load and reset phase, when a logic 1 signal (a gating pulse) is applied to the scan gate from an analog signal scanner.

FIG. 5B is a diagram of the semiconductor surface potential versus distance along the semiconductor surface of a cell at an instant of time in the second interval of a cycle of operation of the apparatus of FIG. 1, referred to as the read phase, when a logic 1 signal controls the voltage waveform applied to the second electrode of the cell.

FIG. 6A also shows a sectional view of a cell of the apparatus of FIG. 1 and also includes a diagram of surface potential versus distance along the semiconductor surface at an instant of time in the first interval or phase of a cycle of operation of the apparatus, referred to as the load and reset phase, when a logic 0 signal (no gating pulse) is applied to the scan gate from the analog signal scanner.

FIG. 6B is a diagram of the semiconductor surface potential versus distance along the semiconductor surface of a cell at an instant of time in the second interval or phase of a cycle of operation of the apparatus of FIG. 1, referred to as the read phase, when a logic 0 signal controls the voltage waveform applied to the second storage electrode of the cell.

Reference is made to FIG. 1 which shows surface charge signal correlation apparatus 10 for obtaining the correlation between a time varying analog signal applied from source 11 and a digital reference word applied from source 12. The apparatus 10 includes an assembly 13 of a plurality of charge transfer devices 14, 15 and 16 formed on a common substrate 17, only three of which are shown for reasons of simplicity in describing the apparatus and explaining the operation thereof. The apparatus also includes a multistage scanner 20, each stage of which is operatively associated with a respective charge transfer device for sequentially gating samples of the analog signal into the charge transfer devices. A reference shift register 22 is also provided, each stage of which is operatively associated with a respective charge transfer devices. Successive bits of the reference word are entered and advanced in the successive stages of the reference shift register 22 to control the signal processing in the charge transfer devices 14-16 and thereby to obtain correlations of the analog signal samples with the reference word. The charge transfer devices 14-16, the scanner 20 and the reference shift register 22 as well as the output circuit of the apparatus are under the control of or timed by a source 24 of clock pulses. Over a first interval of a cycle of operation of the apparatus the potentials on the electrodes of the devices 14-16 are reset to store each previously introduced quantity of charge corresponding to analog signal sample in both the first storage region and a second storage region of a respective device by setting the depletion surface potentials of these regions to the same value. Over a second interval of the cycle of operation the potentials on the electrodes of the devices are changed to transfer the quantities of stored charge within the devices and obtain a read out, as will be explained below in more detail. Each of the analog signal samples is also loaded into a respective device during the first interval.

As shown in FIGS. 2 and 3, the devices 14-16 are formed on a common substrate 17 of, for example, N-type conductivity silicon of suitable resistivity. The substrate is provided with a major surface 18. A layer of thick insulation 25 which may conveniently be silicon dioxide is provided overlying the major surface 18. A plurality of generally rectangular recesses 26 are provided in the thick insulating member 25, each corresponding to the location of a respective charge transfer device. Each of the recesses 26 extends to within a short distance of the major surface of the semiconductor substrate to provide a region of thin insulation 27 lying over the substrate and defining a charge transfer cell therein. Each of the charge transfer cells 14-16 includes a first charge storage region 28 and a second charge storage region 29 spaced from the first charge storage region and defining a respective first intermediate region 30 therebetween, all adjacent the major surface 18. Overlying the thick and thin portions of the insulating member and extending generally perpendicular to the long dimension of the recesses 26 is a conductive member or line 32. The portions of the conducting member 32 lying in the recesses constitute a first plurality of electrodes 32a, each electrode overlying a respective first storage region 28 of a charge transfer device or cell. A second plurality of electrodes 34 are provided, each electrode in a respective recess and each electrode overlying a respective second charge storage region 29 of a charge transfer cell. Terminals 35 provide electrical connection to the electrodes 34. A second layer 37 of thin insulation is provided in each of the recesses 26. Overlying the thick and thin portions of the insulating member and extending generally perpendicular to the long dimension of the recesses 26 is a conductive member or line 36. The portions of the conductivity member 36 lying in the recesses constitute a first plurality of gating electrodes 36a, each overlying a respective intermediate region 30. Also provided in the semiconductor substrate is a diffused region 38 of P-type conductivity spaced from the first charge storage regions 28 of each of the cells and defining a respective second intermediate region 39 therebetween. A second plurality of gating electrodes 40 are provided, each in their respective recess and each overlying a respective second intermediate region 39. Each first storage electrode 32a forms with the substrate 17 a first capacitance. Each second storage 34 electrode forms with the substrate a second capacitance. Each first gating electrode 36 forms with the substrate a third capacitance. The first, second and third capacitances are set so that the sum of the first capacitance and the third capacitance is equal to the second capacitance for reasons which will be explained below.

Referring now particularly to FIG. 1., the first gating electrodes 36 of each of the devices 14-16 are connected to the negative terminal of a source 45 of potential, the positive terminal of which is connected to ground to establish a surface potential in each of the first intermediate regions 30 of a fixed first value. Each of the first storage electrodes 32a of each of the devices 14-16 are interconnected by the line 32 which can be set at a fixed second potential for establishing in each of the first storage regions a depletion surface potential of a second value, as will be explained below. The manner in which the potential of the line 32 is set at the fixed value is by means of a differential amplifier connected to a source 46 of fixed potential, as will also be explained below. The source 46 of potential is set to provide the second value of depletion surface potential to be less in absolute magnitude than the fixed first value of surface depletion potential. The diffused region 38 of opposite conductivity type is connected to an analog signal source 11. Each of the second gating electrodes 40 is connected to a respective stage of the scanner 20. In response to a pilot bit applied to the scanner 20 from a scan bit source 48 a pulse is applied to each of the second gating electrodes 40 in sequence during a first interval of the cycle of operation mentioned above to sample the analog signal appearing on the diffused region 38 and transfer into each of the first and second storage regions of the devices in sequence a respective quantity of charge proportional to a respective sample of the analog signal, as will be explained in more detail below.

A plurality of control circuits 50 are provided, each under the control of a respective stage of reference shift register 22 for applying either a first voltage waveform or a second voltage waveform to a respective second storage electrode 34 depending upon whether a "1" or a "0" bit of a binary reference word is stored in the stage. The first voltage waveform establishes a first level of depletion surface potential in the second storage regions during a first interval thereof and establishes a second level of depletion surface potential during a succeeding second interval thereof. The first level of depletion surface potential is equal to the aforementioned second value of depletion surface potential. The second level of depletion surface potential is greater in absolute magnitude than the aforementioned second value of depletion surface potential in the second storage region and allows the flow of charge thereinto. The second voltage waveform establishes the the aforementioned first level of depletion surface potential in the second storage region during the aforementioned first interval and establishes a third level of depletion surface potential during the aforementioned second interval. The third level of depletion surface potential in the second storage regions is less in absolute magnitude than the aforementioned second value of depletion surface potential and causes charge stored in the second region to flow out of the second region into the first region. The first voltage waveform is obtained from the output of a first voltage source 51 which is synchronized with the clock 24 and is applied to a first buss 52. The second voltage waveform is obtained from a second voltage source 53 which is synchronized with the clock 24 and is applied to a second buss 54.

The reference shift register 22 is under the control of the clock pulse source 24 which causes bits stored in the shift register to shift a cycle at a time from one stage to the next. Bits of the reference word are applied from a reference word source 12 which is also synchronized by the clock 24 to enter the bits in sequence into the shift register 22. Each of the stages of the reference shift register 22 have two output terminals, designated 1 and 2. When a bit, for example a "1", is stored in a stage of the shift register, the output at terminal 1 is high in absolute magnitude and the output at terminal 2 is low, and conversely when a "0" appears in that stage the output at terminal 1 is low and the output at the terminal 2 is high. A strobe generator 57 synchronized with the clock 24 provides at a third buss 58 a gating pulse during the aforementioned first interval of a clock cycle.

Each of the second electrodes 34 of the charge transfer devices 14-16 is connected through the source to drain conduction path of a respective first MOSFET transistor 61 to the first buss 52. Each of the second electrodes 34 is also connected through the source to drain conduction path of a respective second transistor 62 to the second buss 54. Each of the gates of the first transistors 61 is connected through the source to drain conduction path of a respective third transistor 63 to terminal 1 of a respective stage of the shift register 22. Each of the gates of the second transistors 62 is connected through the source to drain conduction path of a respective fourth transistor 64 to terminal 2 of a respective stage of the shift register 22. The gates of the third and fourth transistors 63 and 64 are connected to the third or strobe buss 58. Thus, during the first interval of a cycle of the clock, the third and fourth transistors 63 and 64 are "ON" enabling signals appearing on the first and second terminals of a stage of the shift register to be applied to the gates of the first and second transistor 61 and 62. If the bit stored in a stage is a "1", the output appearing at the terminal 1 is high, and accordingly the first transistor 61 is turned "ON". As the output appearing at terminal 2 of the stage is low the second transistor 62 is not turned "ON". Thus, only the first voltage waveform is applied to the second storage electrode 34. While the strobe pulse on buss 58 appears only during the first interval of a cycle and turns the third and fourth transistors "ON" and "OFF", the gate of the first transistor 61 remains "ON" due to gate capacitance. Thus, the first voltage is applied to the second storage electrode during the occurrence of the strobe pulse and continues to be applied to the second storage electrode for the remainder of a cycle including the first and second intervals. Similarly, if a "0" had been stored in the first stage, the output at terminal 1 would be low and the output at terminal 2 would be high, and accordingly the second voltage waveform appearing on the second buss 54 would have been applied to the second storage electrode 34.

Thus, it is apparent that when the first voltage waveform is applied to a second electrode of one of the devices 14-16 in response to a "1" appearing in the corresponding stage of the reference shift register, a packet of charge representing the analog sample stored in the first storage region is transferred into the second storage region over the second interval of time causing a signal to be induced on the output buss 32 representative of the packet of charge transferred during the second interval. Similarly, when the second voltage waveform is applied to a second storage electrode in response to a "0" appearing in a corresponding stage of the reference shift register a packet of charge is transferred from the second charge storage region to the first charge storage region during the second interval of the cycle, as the depletion surface potential of the second storage region is raised above the depletion surface potential of the first storage region, and causes a signal to be induced on the output buss 32 representative of the packet of charge transferred during the second interval and opposite in sign to the signal induced in the case when the first voltage waveform was applied.

The electrode 32 to which all of the first storage electrodes 32a are connected serves as the output electrode on which is induced a signal proportional to the total net charge transferred to and from the first charge storage regions 28 during the second interval of a cycle of operation. For the purpose of deriving the output signal and also for the purpose of setting and maintaining the potential on the line 32 at a fixed value during the time of analog signal sampling, the output circuit 70 including differential amplifier 71 is provided. The differential amplifier 71 comprises a high gain differential amplifier having an inverting input terminal 72 and a noninverting input terminal 73 and an output terminal 74. The differential amplifier may be any of a variety of operational amplifiers commercially available for example, operational amplifier LM 318 available from National Semiconductor Co. of Santa Clara, Calif. The inverting input terminal 72 is connected to the output line 32. The output terminal 74 is connected to the inverting terminal 72 through a feedback capacitance $C_{FB}$. The non-inverting terminal 73 is connected to the negative terminal of a source 46 of voltage, the positive terminal of which is connected to ground. The potential of the inverting terminal 72 of the high gain differential amplifier with capacitance feedback follows the potential of the noninverting terminal 73. Thus, the differential amplifier delivers a voltage at the output terminal 74 which is proportional to the difference in induced charge on the output line 32 divided by the feedback capacitance $C_{FB}$. A reset switch in the form of a MOSFET transistor 75 is connected across the feedback capacitance $C_{FB}$. When a reset voltage from reset gate generator 76 which is synchronized with clock 24 is applied to the gate of the reset transistor 75, the potential applied to the output line 32 is equal to the potential of the source 46. When the reset switch 75 is opened and thereafter charge is transferred to the first storage regions 28 of the devices 14–16 underlying the first storage electrodes 32a, a signal is induced on the output line 32. The differential amplifier 71 with capacitance feedback operates to maintain the potential on the output line 32 the same as the potential at the non-inverting terminal 73. The resulting charge flow in the output circuit of the amplifier and to the capacitor $C_{FB}$ produces a voltage at output terminal 74 which is proportional to the total net charge transferred to the first storage regions 28. The aforementioned charge sensing circuit is described and claimed in U.S. patent application Ser. No. 591,636, filed June 30, 1975, now U.S. Pat. No. 3,969,636. Alternative means may be provided to sense on the output line 32 the total net charge transferred to the first storage regions 28. For example, after resetting the output line 32, it may be allowed to float and the change in potential thereon sensed to provide the output signal.

The operation of the correlator apparatus of FIG. 1 over a cycle of operation will now be explained in connection with the waveform diagrams of FIGS. 4A through 4H and also in connection with the surface potential diagrams of FIGS. 5A and 5B and FIGS. 6A and 6B. To facilitate description of the operation of the correlator apparatus, specific values of depletion surface potentials in the various regions of the charge transfer devices 14–16 are shown in FIGS. 5A and 5B and FIGS. 6A and 6B. These potentials are produced by applying suitable voltages to the electrodes overlying the various regions of the devices, for example, several volts higher than the indicated depletion surface potentials. The voltages required on the electrodes depends on the materials used and other geometric details for the devices as is well known to those skilled in the art.

FIGS. 4A thru FIG. 4H show waveforms of voltages appearing at various points in the apparatus of FIG. 1 over a period greater than one clock cycle but less than two clock cycles of operation thereof. All of the waveforms are drawn to a common time scale. Each cycle of operation is constituted of two intervals, interval from $t_0$ to $t_2$ is referred to as the first interval, the interval from $t_2$ to $t_4$ is referred to as the second interval. FIG. 4A shows pulses 81 of a first phase voltage $\phi_1$ obtained from the clock 24 and FIG. 4B shows pulses 82 of a second phase voltage $\phi_2$ obtained from the clock. The first phase and second phase clock pulses are utilized to drive the scanner 20 and also to drive the reference shift register 22. FIG. 4C shows a strobe pulse 83 appearing in the first interval of a cycle for enabling either the first voltage waveform or the second voltage waveform referred to above to be applied to a second storage electrode 34 depending on the bit stored in the shift register stage associated with that electrode. FIG. 4D shows the first voltage waveform 84 which is applied to a second storage electrode 34 of a charge transfer device in response to a logic "1" bit appearing in the associated stage of the reference shift register 22. FIG. 4E shows the second voltage waveform 85 which is applied to the second electrode of a charge transfer device when a logic "0" bit appears in the associated stage of the reference shift register 22. FIG. 4F shows the pulse applied to the gate of the reset transistor 75 of the differential amplifier to discharge feedback capacitance $C_{FB}$ during the first interval of a cycle of operation and to release the operation of the differential amplifier 71 just prior to the second or read interval of the cycle to provide an output proportional to the total net transfer of charge to and from the first storage regions 28 underlying electrodes 32a of charge transfer devices during the second or read interval. FIG. 4G shows the potential of the first storage electrodes 32a and the output line 32 of the apparatus. FIG. 4H shows the potential applied to the first gate electrodes 36a of the charge transfer devices.

With the apparatus operating under control of the clock 24, an analog signal is applied to the analog line or diffused region 38 from the analog signal source 11. A pilot bit is applied to the first stage of the scanner 20 and is clocked from one stage to the next in the scanner in synchronism with the clock 24. Bits of a reference word are applied from the reference word source 12 to the first stage of the reference shift register 22 and are clocked bit by bit from one stage to the next in synchronism with the clock. Consider the sequence of operation of a single charge transfer device, in particular the first charge transfer device 14, assuming that a pilot bit appears in the first stage of the scanner 20 and that a logic "1" also appears in the first stage of the reference shift register 22. The conditions existing in the charge transfer device at the instant $t_1$ in the first interval of the cycle of operation thereof is depicted in FIG. 5A. At time $t_1$ a strobe pulse is applied to the control circuit 50 of the first device 14 and as a logic "1" bit appears in the first stage of the reference shift register 22, the first voltage waveform 84 is applied to the second storage electrode 34. As the first voltage waveform is −12 volts over the first interval, $t_0$–$t_2$, the depletion surface potential of the second storage region 29 underlying the second electrode 34 is the same as the depletion surface potential of the first storage region 28 underlying electrode 32a. The logic "1" condition in the first stage of the scanner lowers the surface potential under the scan gate 40 and allows charge to flow from the diffused region 38 into the first storage region 28 and the second storage region 29 and equilibrate with the amplitude of the signal at that instant of time. On termination of the pulse on the scan gate 40 a quantity of charge $Q_1$ is stored in the first storage region underlying the first storage electrode which is proportional to the amplitude of the analog signal. During the second interval, $t_2$–$t_4$, the first voltage waveform drops to a value of −22 volts thereby enabling the quantity or packet of charge stored in the first storage region to flow into the second storage region underlying the second storage electrode as shown in FIG. 5B and would, for example, represent the condition existing at instant of time $t_3$ in the second interval. Just prior to the drop of the first voltage to the −22 volts, the reset switch 75 is opened and the charge flowing out of the first storage region is sensed on line 32 by the output charge sensing circuit, as explained above.

Consider now the operation of the second charge transfer device 15 over the same cycle. Assume a logic "0" condition exists in the second stage of scanner 20 and no pulse appears on the scan gate 40 of the device. Thus, during the first interval $t_o$–$t_2$, the charge that had been previously stored in the device 15 continues to be stored therein. As both the first voltage waveform 84 and the second voltage waveform 85 are −12 volts over the first interval $t_o$–$t_2$, the depletion surface potential of the second storage region 29 underlying the second electrode 34 is the same as the depletion surface potential of the first storage region 28 underlying electrode 32a. Consequently, the charge equilibrates over the regions underlying the electrodes 32a, 36a and 34 and the charge $Q_2$ continues to be stored in the first storage region under the first electrode 32a as shown in FIG. 6A. As the bit stored in the second stage of the reference shift register 22 is a "0", upon appearance of the strobe pulse at time $t_1$ during the first interval, a high level appears at terminal 2 of the second stage thereby actuating the gate of the second transistor 62 to apply the second voltage waveform 85 to the second electrode 34 of the second device 15. During the second interval of time the second voltage waveform rises to minus 3 volts thereby allowing a portion, $Q_2$, of the total charge stored in the second storage region to flow into the first storage region, and allowing the remainder of the total charge to flow into the intermediate region 30, as depicted in FIG. 6B, representing conditions at time $t_3$. The flow of charge into the storage region underlying the first electrode induces a signal on the electrode 32a opposite in sign to the signal induced when charge was transferred out of the storage region lying thereunder. Thus, as charge was transferred out of the first storage region of the first device 14 during the second or read interval and charge was transferred into the first storage region of the second device 15 during the second or read interval, a net signal is developed on the output line 32 which represents the net transfer of charge in the two devices. Similar action takes place in each of the other devices of the apparatus. Accordingly, at each clock cycle a correlation support output is obtained at the output terminal 74 of the differential amplifier circuit 71. Mathematically, the output $V_{out}$ may be represented by the equation:

$$V_{out} = K \Sigma Q_n W_n,$$

where $Q_n$ is the charge stored in the $n^{th}$ cell; $W_n$ is equal to +1 if the binary bit located in the $n^{th}$ stage of the reference shift register is a logic "1" bit, and $W_n$ is equal to −1 if the $n^{th}$ bit is a logic "0" bit; and $K$ is a constant.

In the operation of the charge transfer devices 14 and 15 in the examples described above, after the voltage levels of the first and second voltage waveforms 84 and 85 applied to second electrodes 34 are switched, surface potentials are set up in the devices energetically favorable to charge transfer in the storage regions thereof. In device 14 the charge transfers from the second storage region to the first storage region and in device 15 the charge transfers from the first storage region to the second storage region thereof. Both charge transfers take place over a finite period of time with the major portion of charge transferring in times less than a few nanoseconds. The switched voltage levels of the first and second voltage waveforms in the second interval are maintained for a sufficient period of time such that substantially all the charge is transferred. Such a period is indicated in FIGS. 4D and 4E from time $t_2$ to time $t_3$ for example.

In the surface charge signal correlation apparatus of the aforementioned U.S. Pat. No. 3,801,883 described in brief above, the charge transfer device constituting the signal processing channels or cells included at least three storage regions and a plurality of gating electrodes as well as a pair of output lines. In each of the devices an analog signal sample is stored in a second storage region and is transferred into either an adjacent first storage region or into an adjacent third storage region depending upon whether a "1" or a "0" appeared in the associated stage of the reference word shift register. A first output appears on a first line representing the summation of the analog signal samples summed with one sign and a second output appears on a second line representing the summation of the analog signal samples summed with the opposite sign. A differential amplifier is provided to obtain the correlation output. In accordance with the present invention the charge transfer devices utilized in the apparatus are of simpler structure utilizing just two storage regions. In addition the correlation output is obtained directly on a single line which directly sums the analog signal samples with one and the opposite sign depending upon whether charge is transferred into or out of a storage region underlying a first electrode. In addition, as each of the charge transfer devices has just a single transfer gate which is maintained at a fixed potential, drive voltage feedthrough from the second storage electrodes to the first storage electrodes is avoided.

While the invention has been described in connection with shift registers to provide a sequence of reference bits for controlling the charge storage cells, other means may be used. For example, the gates of transistors 61 and 62 may be connected to the output ports of read only or random access memories and the reference word determined by the data stored and addressed therein. Also, while one manner of applying the first and second waveforms to the second electrodes of the devices has been shown and described, it is apparent that alternative means may be utilized.

While the invention has been described in connection with charge transfer devices constituted of N-type conductivity substrates, P-type conductivity substrates could as well be used. Of course, in such a case the applied potentials, diffusions and carrier types would be reversed in polarity.

While the invention has been described in a specific embodiment, it will be appreciated that modifications may be made by those skilled in the art, and it is intended by the appended claims to cover all such modifications and changes as fall within the true spirit and scope of the invention.

What I claim as new and desire to secure by Letters Patent of the United States is:

1. Signal correlator apparatus comprising
   a substrate of semiconductor material having a major surface,
   first means forming a first plurality of charge storage regions adjacent said major surface of said substrate,
   second means forming a second plurality of charge storage regions adjacent said major surface of said substrate, each forming with a respective first charge storage region a respective charge storage cell,
   said first means including a first plurality of electrodes, each electrode insulatingly overlying a respective charge storage region of said first plurality, said electrodes being interconnected,
   said second means including a second plurality of electrodes, each insulatingly overlying a respective charge storage region of said second plurality,
   a plurality of intermediate charge storage regions adjacent said major surface of said substrate, each separating first and second storage regions of a respective charge storage cell,
   a plurality of first gating electrodes each insulatingly overlying a respective one of said intermediate regions, said gating electrodes being interconnected,
   each first storage electrode forming with said substrate a first capacitance, each second storage electrode forming with said substrate a second capacitance, each first gating electrode forming with said substrate a third capacitance, the sum of said first capacitance and said third capacitance being equal to said second capacitance,
   means for introducing into each of successive ones of said cells a respective one of successive quantities of charge, each quantity being proportional to a respective sample of a time varying analog signal, each quantity of charge including first and second portions of equal value, each first portion of a quantity of charge being solely contained in the first storage region of a respective cell and each second portion of said quantity of charge being contained in the second storage region of said respective cell,
   means for applying to each of said second storage electrodes a voltage waveform selected from a first voltage waveform and a second voltage waveform of the same periodicity in response to a respective one of a series of successive binary bits of a reference word,
   a. the bits of a first value in said series of bits forming a first group of bits and providing said first voltage waveform to the second electrodes associated with a first group of cells, said first voltage waveform enabling said first portions of said quantities of charge to be stored in said first storage regions of said first group of cells and said second portions of said quantities of charge to be stored in the second storage regions of said first group of cells during a first interval of a period thereof, and causing said first portions of said quantities of charge to be transferred to said second storage regions of said first group of cells during a second interval of a period thereof,
   b. the bits of a second value in said series of bits forming a second group of bits and providing said second voltage waveform to the second electrodes associated with a second group of cells, said second voltage waveform enabling said first portions of said quantities of charge to be stored in said first storage regions of said second group of cells and said second portions of said quantities of charge to be stored in the second storage regions of said second group of cells during a first interval of a period thereof, and causing said second portions of said quantities of charge to be transferred to said first storage regions of said second group of cells during a second interval of a period thereof,
   means connected in circuit with said first storage electrodes for sensing the total net charge transferred to and from said first charge storage regions during said second interval.

2. The apparatus of claim 1 in which said substrate of semiconductor material is of one conductivity type and said quantities of charge are in the form of minority carriers in said substrate.

3. The apparatus of claim 1 in which is provided
   means for applying a fixed first potential to said first gating electrodes to establish a depletion surface potential in each of said intermediate regions of a first value,
   means for applying during said first interval a second potential to said first storage electrodes to establish a depletion surface potential of a second value in each of said first storage regions, said second value being less in absolute magnitude than said first value.

4. The apparatus of claim 1 in which is provided periodically shifting each of the successive bits of said binary reference word one bit position with respect to the successive cells controlled thereby with the same periodicity as said first and second voltage waveforms.

5. The apparatus of claim 3 in which is provided a first shift register in which the successive bits of said reference word are stored therein, said successive bits being shifted serially in one direction one bit position at a time at the periodicity of said first and second voltage waveforms.

6. The apparatus of claim 1 in which charge is introduced into said cells and charge is reestablished in selected cells during the first interval of said first and second voltage waveforms.

7. The apparatus of claim 6 in which a scan shift register is provided and in which the selected cells consist of a single cell which is determined by the position of a scan bit in said scan shift register, and which also includes means for applying a scan bit to the input of said shift register, and means synchronized with said first and second voltage waveforms for shifting said scan bit, whereby said stored samples constitute a series of sequential samples of an analog input signal.

8. The apparatus of claim 3 in which
said first voltage waveform establishes a first level of depletion surface potential in the second storage regions of said first group of cells during a first interval thereof and a second level of depletion surface potential during a succeeding second interval thereof, said first level of depletion surface potential being equal to said fixed second value of depletion surface potential and said second level of depletion surface potential being greater in absolute magnitude than said fixed first value of depletion surface potential, said second voltage waveform establishes said first level of depletion surface potential in said second storage region during said first interval and a third level of depletion surface potential during said second interval, said third level of depletion surface potential being less in absolute magnitude than said fixed second value of depletion surface potential, whereby during said first interval charge is stored in said first and second groups of cells and during said second interval charge is transferred from the first charge storage regions of said first group of cells to the second charge storage regions thereof and charge is also transferred from the second charge storage regions of said second group of cells to the first charge storage regions thereof.

* * * * *